United States Patent
Cox et al.

(10) Patent No.: US 8,123,881 B2
(45) Date of Patent: Feb. 28, 2012

(54) DIE-TO-ROBOT ALIGNMENT FOR DIE-TO-SUBSTRATE BONDING

(75) Inventors: Damon K. Cox, Round Rock, TX (US); Todd J. Egan, Fremont, CA (US); Michael X. Yang, Palo Alto, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 758 days.

(21) Appl. No.: 12/248,204

(22) Filed: Oct. 9, 2008

(65) Prior Publication Data
US 2009/0126851 A1    May 21, 2009

Related U.S. Application Data

(60) Provisional application No. 60/979,266, filed on Oct. 11, 2007.

(51) Int. Cl.
*B32B 37/00* (2006.01)

(52) U.S. Cl. .............. 156/64; 29/721; 29/739; 29/740; 438/107; 438/108

(58) Field of Classification Search .............. 156/64; 29/721, 739, 740; 438/107, 108
See application file for complete search history.

(56) References Cited

U.S. PATENT DOCUMENTS
7,727,800 B2 *   6/2010   Wan et al. .............. 29/721
* cited by examiner

*Primary Examiner* — Jeff Aftergut
(74) *Attorney, Agent, or Firm* — Blakely Sokoloff Taylor & Zafman LLP

(57) ABSTRACT

A method, a system and a computer readable medium having a set of instructions stored thereon for die-to-robot alignment for die-to-substrate bonding are described. First, a robot is aligned with a substrate to provide a pre-aligned robot. Next, a die is aligned with the pre-aligned robot to provide a robot-aligned die. Finally, the robot-aligned die is bonded to a region of the substrate. The substrate is held stationary immediately following the aligning of the robot with the substrate and at least until the robot-aligned die is bonded to the region of the substrate.

8 Claims, 6 Drawing Sheets

Die-to-substrate bonding system (400)

DIE-TO-ROBOT ALIGNMENT FOR DIE-TO-SUBSTRATE BONDING

CROSS-REFERENCE TO RELATED APPLICATIONS

This application claims the benefit of U.S. Provisional Application No. 60/979,266 filed Oct. 11, 2007, the entire contents of which are hereby incorporated by reference herein.

BACKGROUND

1) Field

The invention is in the field of semiconductor processing equipment and, in particular, die-to-robot alignment for die-to-substrate bonding.

2) Description of Related Art

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. One approach for increasing functionality is to bond two or more integrated circuits together to form a multi-chip or multi-die system.

DETAILED DESCRIPTION

A method, a system and a computer readable medium having a set of instructions stored thereon for die-to-robot alignment for die-to-substrate bonding are described. In the following description, numerous specific details are set forth, such as order of operations, in order to provide a thorough understanding of the present invention. It will be apparent to one skilled in the art that the present invention may be practiced without these specific details. In other instances, well-known features, such as bonding mechanisms, are not described in detail in order to not unnecessarily obscure the present invention. Furthermore, it is to be understood that the various embodiments shown in the Figures are illustrative representations and are not necessarily drawn to scale.

Disclosed herein are a method, a system and a computer readable medium having a set of instructions stored thereon for die-to-robot alignment for die-to-substrate bonding. A robot may be aligned with a substrate to provide a pre-aligned robot. In an embodiment, a die is then aligned with the pre-aligned robot to provide a robot-aligned die. The robot-aligned die may finally be bonded to a region of the substrate. In one embodiment, the substrate is held stationary immediately following the aligning of the robot with the substrate and at least until the robot-aligned die is bonded to the substrate.

Die-to-substrate bonding using robot-to-substrate alignment followed by die-to-robot alignment may enable accurate die-to-substrate bonding without the use of direct die-to-substrate alignment. This may be beneficial in cases where direct die-to-substrate alignment is frustrated by any of a number of difficulties, e.g. non-transparency when die and substrate are overlapping. Furthermore, by aligning the die off-substrate to a pre-aligned robot, multiple die may be bonded in such a way as to substantially increase the throughput of the bonding process. For example, in accordance with an embodiment of the present invention, while one robot-aligned die is being bonded by a first pre-aligned robot to a first region of a substrate, a second die is aligned off-substrate to a second pre-aligned robot at substantially the same time. Then, the second robot is used to bond the second robot-aligned die to a second region of the substrate. In a specific embodiment, a third die is meanwhile aligned to the first pre-aligned robot, and so on. In an alternative embodiment, three or more robots are used in a die-to-substrate bonding process.

Figure 1:
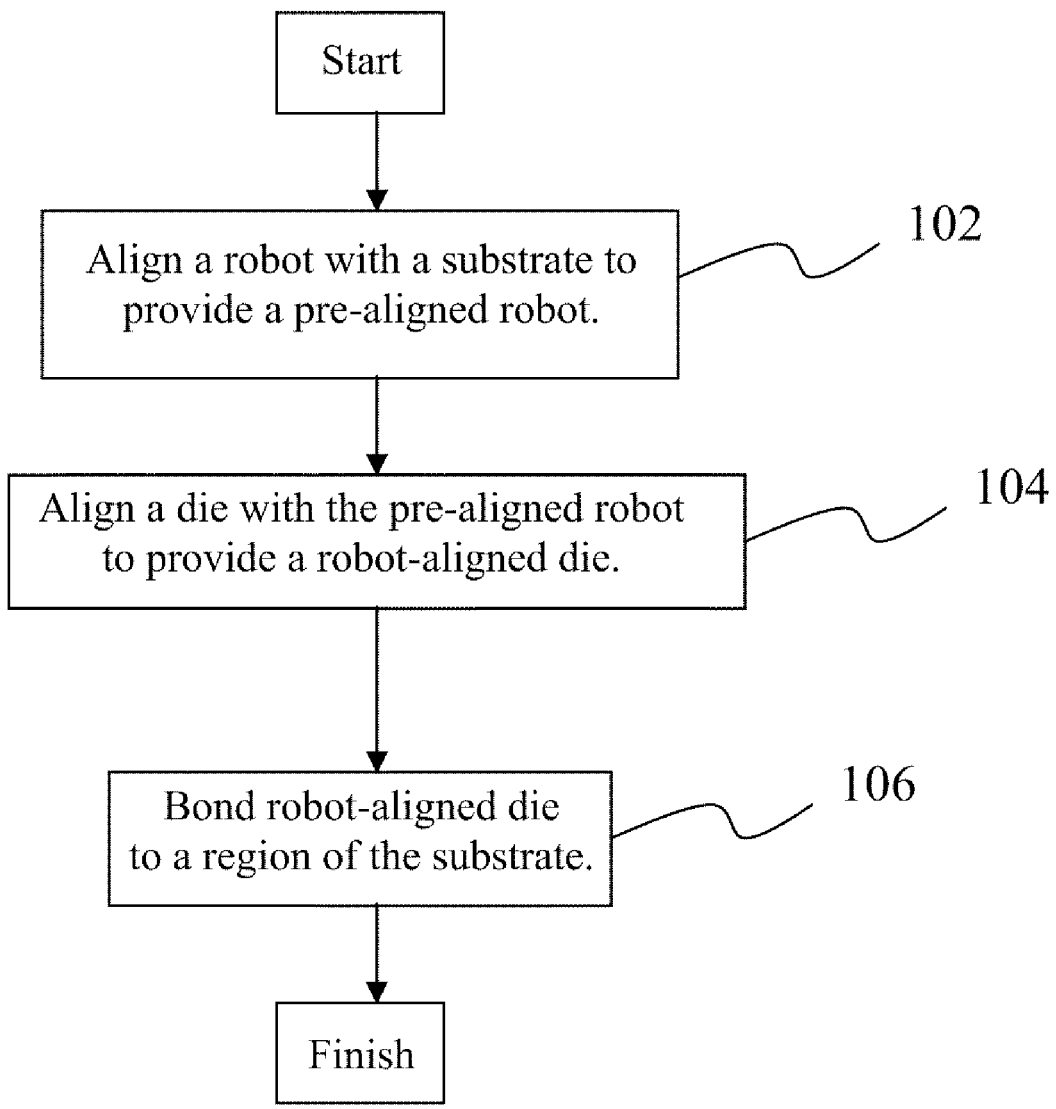
FIG. 1 is a flowchart 100 representing a series of operations for die-to-substrate bonding, in accordance with an embodiment of the present invention.
Figure 2A:
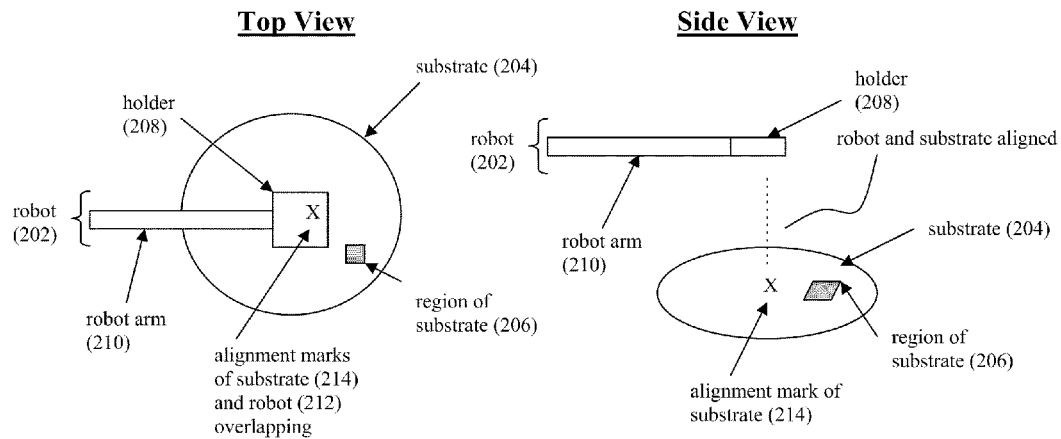
FIGS. 2A-2C illustrate the series of operations for die-to-substrate bonding as correlated with flowchart 100 from FIG. 1, in accordance with an embodiment of the present invention.
Figure 2B:
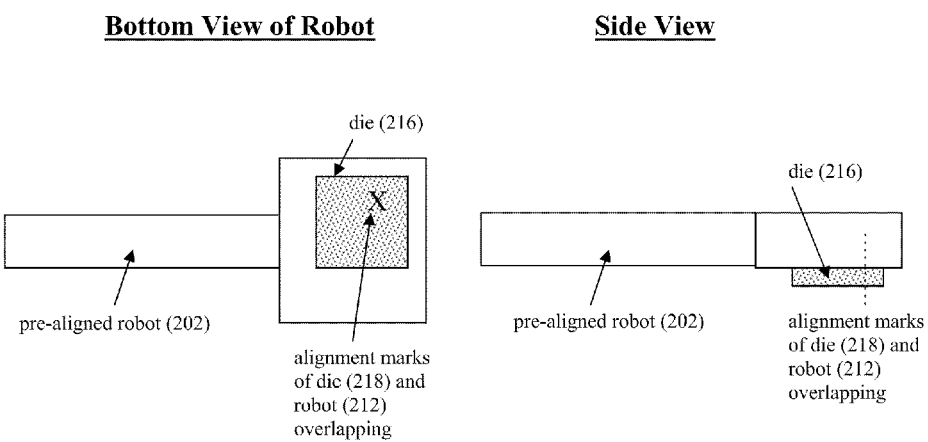
Figure 2C:
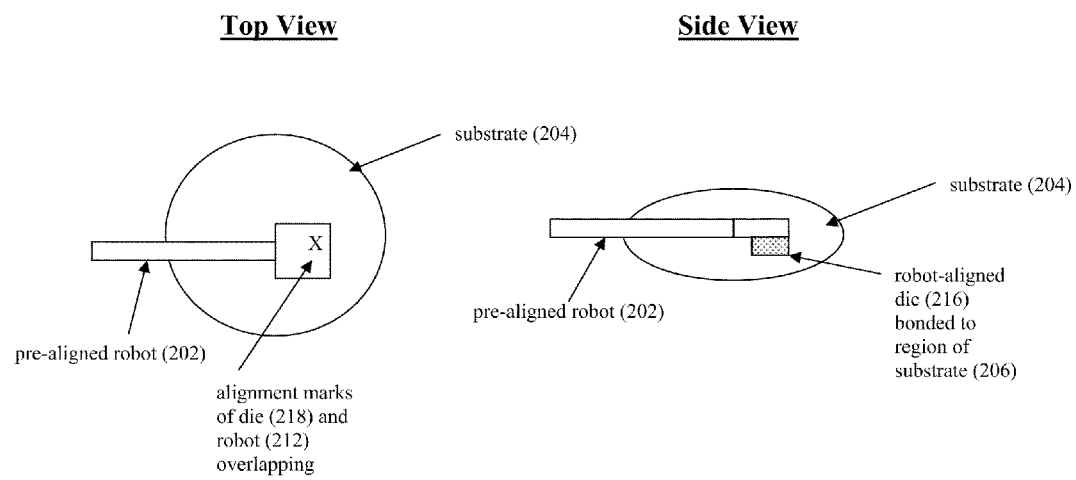

A die may be bonded to a substrate by using die-to-robot alignment with a pre-aligned robot. FIG. 1 is a flowchart 100 representing a series of operations for die-to-substrate bonding, in accordance with an embodiment of the present invention. FIGS. 2A-2C illustrate the series of operations for die-to-substrate bonding as correlated with flowchart 100 from FIG. 1, in accordance with an embodiment of the present invention.

Referring to operation 102 of flowchart 100 and corresponding FIG. 2A, a robot 202 is aligned with a substrate 204 to provide a pre-aligned robot.

Robot 202 may be any moveable device suitable for holding and transporting a die from an off-substrate location to a region 206 of substrate 204 for die-to-substrate bonding. For example, in accordance with an embodiment of the present invention, robot 202 is a gantry comprised of a holder 208 and a robot arm 210. In one embodiment, robot 202 has an alignment mark 212 thereon.

Substrate 204 may be any entity onto which a die will be bonded. For example, in accordance with an embodiment of the present invention, substrate 204 is comprised of semiconductor dice having interconnect lines exposed at the top surface of substrate 204. In one embodiment, substrate 204 has an alignment mark 214 thereon. In a specific embodiment, alignment mark 214 of substrate 204 is located in region 206 to which a die will be bonded. In an alternative embodiment, alignment mark 214 is located on a portion of substrate 204 to which a die will not be bonded, such as a wafer notch or an inter-dice scribe-line.

Robot 202 may be aligned to substrate 204 by any method suitable to provide substantial alignment between robot 202 and substrate 204. In an embodiment, the type of alignment used to align substrate 204 with robot 202 is selected from the group consisting of translational alignment, rotational alignment, planarity alignment and a combination of two or more thereof. In one embodiment, in addition to moving robot 202 during the alignment of robot 202 to substrate 204, substrate 204 is also moved during the alignment. However, in an alternative embodiment of the present invention, substrate 204 is held stationary during the aligning of robot 202 to substrate 204 (that is, robot 202 is moveable while substrate 204 is stationary during the aligning of robot 202 to substrate 204). In one embodiment, robot 202 is aligned to substrate 204 by aligning alignment mark 212 with alignment mark 214, as depicted in FIG. 2A. In an alternative embodiment, robot 202 is aligned to substrate 204 by aligning an alignment mark other than alignment mark 212 with alignment mark 214. In a specific embodiment, robot 202 is aligned to substrate 204 by an alignment technique selected from the group consisting of optical transparency alignment, IR transmission alignment, substrate-back-side alignment, through-substrate hole alignment, inter-substrate-robot microscope alignment and face-to-face alignment. In a particular embodiment, robot 202 is aligned to substrate 204 by aligning alignment mark 212 with alignment mark 214 with an overlap error margin of at most 1 micron.

Once robot 202 is aligned to substrate 204, it may be desirable to hold substrate 204 stationary. Thus, in accordance with an embodiment of the present invention, substrate 204 is held stationary immediately following the aligning of robot 202 with substrate 204 and at least until a subsequently generated robot-aligned die is bonded to substrate 204.

Referring to operation 104 of flowchart 100 and corresponding FIG. 2B, a die 216 is aligned with pre-aligned robot 202 to provide a robot-aligned die, wherein robot 202 was pre-aligned with substrate 204 in previous operation 102.

Die 216 may be any die suitable for bonding with substrate 204. For example, in accordance with an embodiment of the present invention, die 216 is a semiconductor chip. In one embodiment, die 216 has an alignment mark 218 thereon.

Die 216 may be aligned to pre-aligned robot 202 by any method suitable to provide substantial alignment between die 216 and pre-aligned robot 202. In one embodiment, the type of alignment used to align pre-aligned robot 202 with die 216 is selected from the group consisting of translational alignment, rotational alignment, planarity alignment and a combination of two or more thereof. In accordance with an embodiment of the present invention, die 216 is aligned to pre-aligned robot 202 by aligning alignment mark 218 with alignment mark 212. In one embodiment, die 216 is aligned to pre-aligned robot 202 by an alignment technique selected from the group consisting of optical transparency alignment, IR transmission alignment, die-back-side alignment, through-die hole alignment, inter-die-robot microscope alignment and face-to-face alignment. In a specific embodiment, die 216 is aligned to pre-aligned robot 202 by aligning alignment mark 218 with alignment mark 212 with an overlap error margin of at most 1 micron. In a particular embodiment, die 216 is aligned to pre-aligned robot 202 off-substrate, i.e. away from the space over the surface of substrate 204.

Referring to operation 106 of flowchart 100 and corresponding FIG. 2C, die 216 is bonded to region 206 of substrate 204, wherein die 216 was robot-aligned in previous operation 104.

Robot-aligned die 216 may be bonded to region 206 of substrate 204 by any method suitable to provide substantial mechanical bonding between robot-aligned die 216 and substrate 204. In accordance with an embodiment of the present invention, robot-aligned die 216 is bonded to substrate 204 by a method that provides both mechanical and electrical bonding. In one embodiment, robot-aligned die 216 is bonded to substrate 204 by a method selected from the group consisting of dielectric bonding, adhesive bonding, copper bonding, solder bonding, eutectic bonding, and metal/adhesive redistribution layer bonding. In a specific embodiment, robot-aligned die 216 is bonded to substrate 204 at a temperature of less than approximately 400° C. In a particular embodiment, interconnect lines from robot-aligned die 216 are bonded to interconnect lines on the surface of region 206 of substrate 204.

The alignment of a robot to a substrate described in an embodiment above involves direct robot-to-substrate alignment wherein the substrate is held stationary immediately following the aligning of the robot with the substrate and at least until a robot-aligned die is bonded to the substrate. In accordance with another embodiment of the present invention, direct robot-to-substrate alignment is carried out by holding the robot stationary (and, hence, moving the substrate) immediately following the aligning of the robot with the substrate and at least until a robot-aligned die is bonded to the substrate. Alternatively, a robot may be aligned indirectly with a substrate. In accordance with an alternative embodiment of the present invention, the position of a substrate is first determined by a fixed alignment apparatus. The substrate is then moved away from the fixed alignment apparatus. Next, a robot is aligned to the fixed alignment apparatus according to the positioning of the substrate determined by the fixed alignment apparatus. In one embodiment, the substrate is finally moved back to its original position and the pre-aligned robot is used to bond a robot-aligned die to the substrate.

Figure 3:
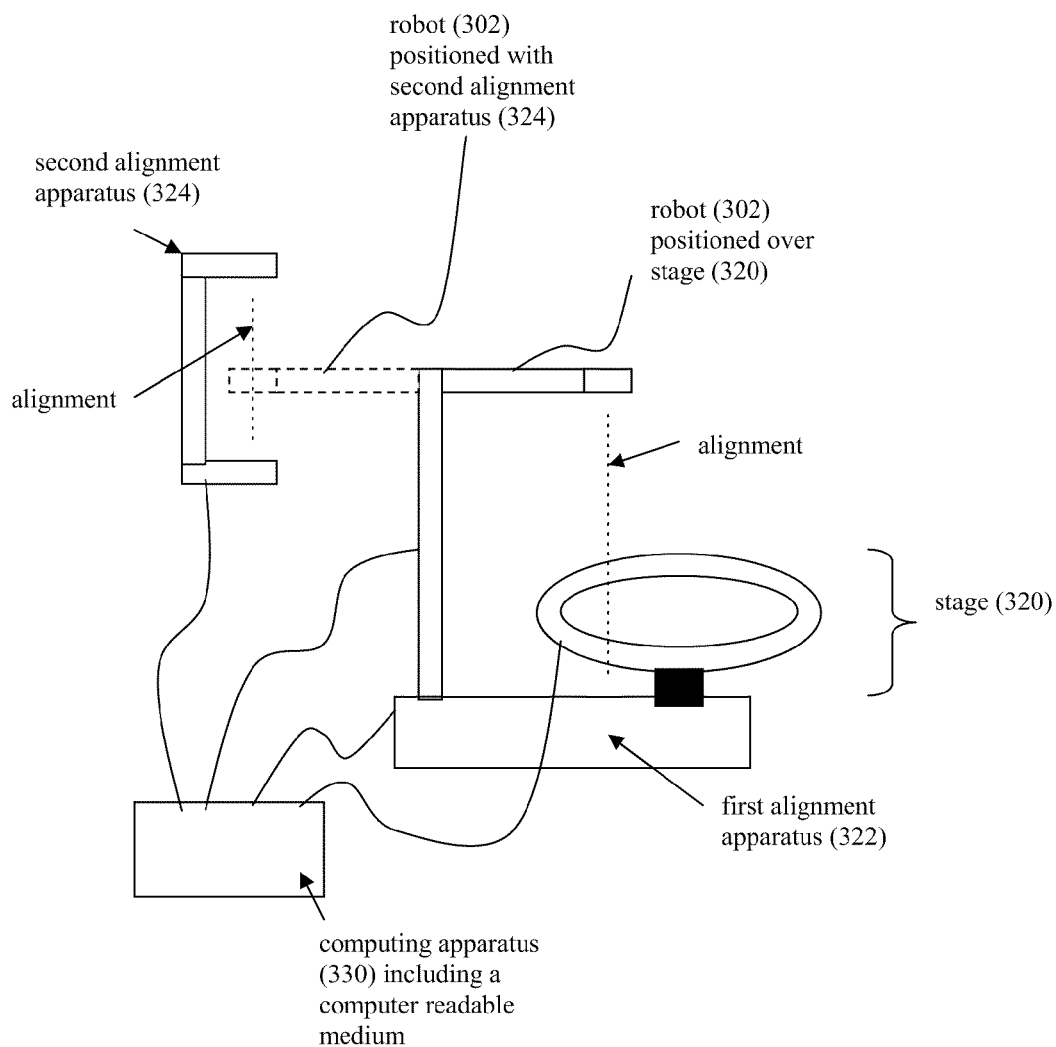
FIG. 3 illustrates a die-to-substrate bonding system suitable for die-to-substrate bonding using robot-to-substrate alignment, in accordance with an embodiment of the present invention.

Die-to-substrate bonding using robot-to-substrate alignment may be carried out in a die-to-substrate bonding system. FIG. 3 illustrates a die-to-substrate bonding system suitable for die-to-substrate bonding using robot-to-substrate alignment, in accordance with an embodiment of the present invention.

Referring to FIG. 3, a die-to-substrate bonding system 300 comprises a robot 302, a stage 320, a first alignment apparatus 322 and a second alignment apparatus 324. First alignment apparatus 322 is coupled with robot 302 and stage 320. Second alignment apparatus 324 is coupled with robot 302.

Robot 302 may be any apparatus suitable for bonding a die to a substrate. For example, in accordance with an embodiment of the present invention, robot 302 is similar to robot 202 described in association with FIGS. 2A-2C. Stage 320 may be any apparatus suitable for holding a substrate stationary immediately following a robot-to-substrate alignment process. In one embodiment, stage 320 is partially transparent to enable an alignment operation. First alignment apparatus 322 may be any alignment apparatus suitable for aligning robot 302 with a substrate supported by stage 320. Second alignment apparatus 324 may be any alignment apparatus suitable for aligning robot 302 with a die. In one embodiment, first alignment apparatus 322 and second alignment apparatus 324 are any alignment apparatuses selected from the group consisting of an optical transmitter, an IR transmitter and a microscope. In an alternative embodiment, a single alignment apparatus is used in place of first alignment apparatus 322 and second alignment apparatus 324 in order to compact die-to-substrate bonding system 300.

Die-to-substrate bonding system 300 may further be coupled with a computing apparatus 330, as depicted in FIG. 3. In accordance with an embodiment of the present invention, computing apparatus 330 includes a computer readable medium. The computer readable medium has a set of instructions stored thereon which, when executed by a processor, cause a method to be performed, the method comprising the operations: A) aligning a moveable robot 302 with a substrate on stage 320 to provide a pre-aligned robot 302, B) aligning a die with pre-aligned robot 302 to provide a robot-aligned die and C) bonding the robot-aligned die to a region of the substrate on stage 320, wherein the substrate is held stationary immediately following the aligning of the robot with the substrate and at least until the robot-aligned die is bonded to the substrate.

Die-to-substrate bonding using a substrate-pre-aligned robot wherein a substrate is held stationary immediately following the aligning of the robot with the substrate and at least until a robot-aligned die is bonded to the substrate may enable a high throughput bonding process. In accordance with an embodiment of the present invention, by holding a substrate stationary immediately following robot-to-substrate alignment and at least until a robot-aligned die is bonded to the substrate, multiple robots may be used in unison for multi-die-to-substrate bonding. Thus, the present invention is not limited to a die-to-substrate bonding system having a single robot. In one embodiment, a die-to substrate bonding system has at least two robots. The robots are aligned to a substrate and then used to bond die to that substrate. The substrate is held stationary immediately following the aligning of the robots with the substrate and at least until one or more robot-aligned dice are bonded to the substrate. In a specific embodiment, by keeping the substrate stationary immediately following robot alignment, a single reference point is maintained for all pre-aligned robots. Thus, more than one pre-aligned robot may be used at a time.

Figure 4A:
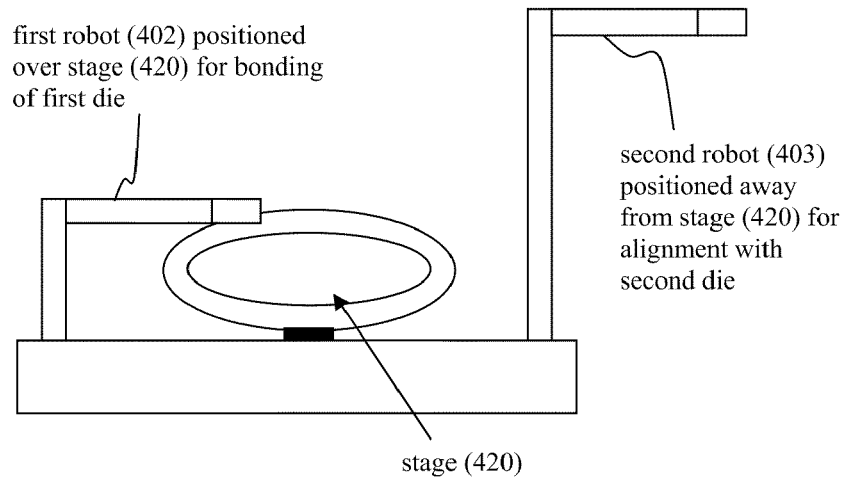
FIGS. 4A-4B illustrate a die-to-substrate bonding system having multiple robots, in accordance with an embodiment of the present invention.
Figure 4B:
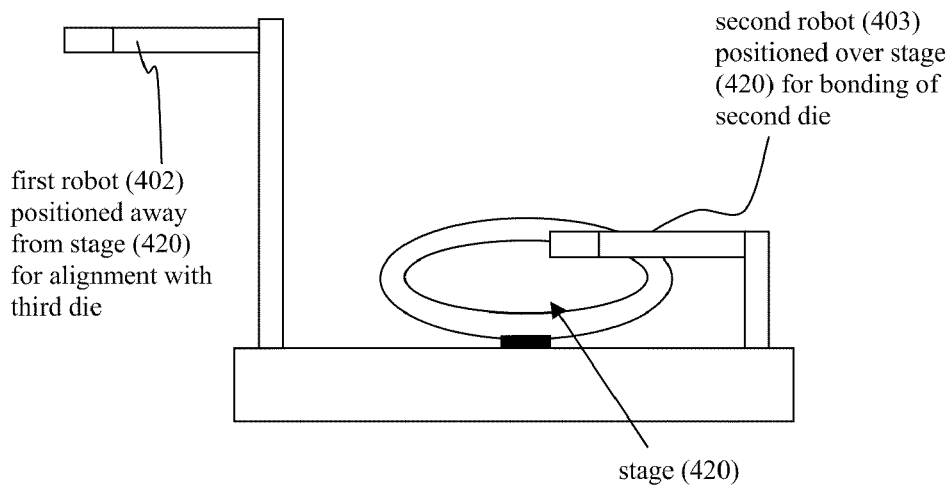

A die-to-substrate bonding system having two or more robots may substantially increase the throughput of the bonding process. FIGS. 4A-4B illustrate a die-to-substrate bonding system having multiple robots, in accordance with an embodiment of the present invention.

Referring to FIG. 4A, a die-to-substrate bonding system 400 comprises a first robot 402, a second robot 403 and a stage 420. In one embodiment, while a first robot-aligned die is being bonded by first pre-aligned robot 402 to a first region of a substrate on stage 420, a second die is aligned off-substrate to second pre-aligned robot 403 at substantially the same time. Then, second robot 403 is used to bond the second robot-aligned die to a second region of the substrate while first robot 402 is aligned to a third die, and so on. In a specific embodiment, a die-to-substrate bonding process using multiple robots in a robot-to-substrate then die-to-robot alignment sequence enables a bonding throughput of approximately 700 milliseconds/die. The robots of die-to-substrate bonding system 400 need not be aligned or calibrated to a particular substrate with each bonding operation. That is, once a robot is pre-aligned to a particular substrate, the alignment may be sufficient for the duration of several iterative die-to-substrate bonding steps. In one embodiment, a pre-aligned robot is used without realigning the robot to a substrate until the occurrence of an event selected from the group consisting of the introduction of a new substrate, a temperature fluctuation or a system motion bump.

The present invention is not limited to die-to-substrate bonding wherein the timing of the bonding of single die to a substrate is in series only. In accordance with an additional embodiment of the present invention, at least two die are bonded to the substrate in a single bonding step, i.e. the die are bonded as single group. In one embodiment, each die bonded is bonded by a separate robot wherein each robot is working in unison with each other. In another embodiment, more than one die is bonded by a single robot in a single bonding step. Accordingly, in addition to being bonded in series, die may also be bonded in parallel. Thus, in accordance with another embodiment of the present invention, a die-to-substrate bonding process involves bonding wherein the timing is both in parallel and in series in order to increase the throughput of the bonding process.

The present invention is not limited to die-to-substrate bonding on a single surface of the substrate. In accordance with an additional embodiment of the present invention, die-to-substrate bonding via robot-to-substrate then die-to-robot alignment is used to bond die to both sides of a substrate, forming a multi-stacked structure. In one embodiment, a first robot is used to bond a first die to the top surface of a substrate, while a second robot is used to bond a second die to the bottom surface of the substrate. In a specific embodiment, the first die and the second die, on either side of the substrate, are aligned co-axially with one another.

In another aspect of the present invention, a bonding process involving robot pre-alignment is used to bond entities other than bonding a die to a substrate. In accordance with another embodiment of the present invention, a bonding system incorporating robot pre-alignment is used to bond any two entities of differing size, i.e. to bond a small entity to a large entity. In an embodiment, a robot is pre-aligned to the large entity to generate a pre-aligned robot. The small entity is then aligned to the pre-aligned robot to generate a robot-aligned small entity. Finally, the robot-aligned small entity is aligned to the large entity. In one embodiment, the large entity is held stationary immediately following the aligning of a moveable robot to the large entity and at least until a small entity is bonded to the large entity. The large and small entities need not be of the same type, i.e. one type of entity may be bonded to another type of entity. In a specific embodiment, the entity types are selected from the group consisting of substrates, semiconductor chips, wafers, flat panel displays, solar panels and packages. Alternatively, the large and small entities may be of the same type. For example, in a particular embodiment, a bonding process involving robot pre-alignment is used to bond a first wafer having a first diameter to a second wafer having a second diameter, wherein the first diameter is smaller than the second diameter.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

Figure 5:
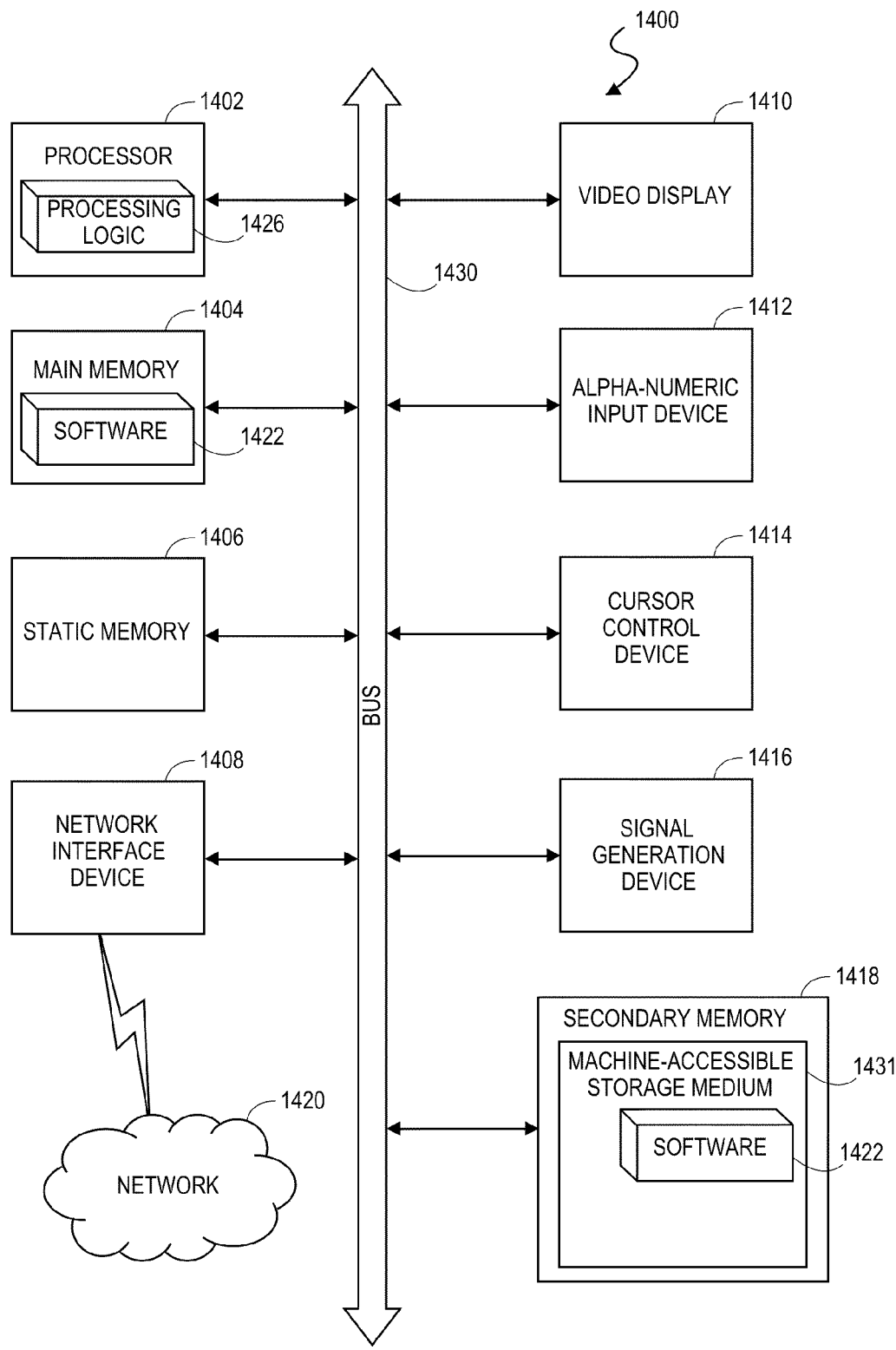
FIG. 5 illustrates a diagrammatic representation of a machine in the exemplary form of a computer system within which a set of instructions, for causing the machine to perform any one or more of the methodologies discussed herein, may be executed, in accordance with an embodiment of the present invention.

FIG. 5 illustrates a diagrammatic representation of a machine in the exemplary form of a computer system 1400 within which a set of instructions, for causing the machine to perform any one or more of the methodologies discussed herein, may be executed, in accordance with an embodiment of the present invention. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1400 includes a processor 1402, a main memory 1404 (e.g., read-only memory (ROM), flash memory, dynamic random access memory (DRAM) such as synchronous DRAM (SDRAM) or Rambus DRAM (RDRAM), etc.), a static memory 1406 (e.g., flash memory, static random access memory (SRAM), etc.), and a secondary memory 1418 (e.g., a data storage device), which communicate with each other via a bus 1430.

Processor 1402 represents one or more general-purpose processing devices such as a microprocessor, central processing unit, or the like. More particularly, the processor 1402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1402 may also be one or more special-purpose processing devices such as an application specific integrated circuit (ASIC), a field programmable gate array (FPGA), a digital signal processor (DSP), network processor, or the like. Processor 1402 is configured to execute the processing logic 1426 for performing the operations and steps discussed herein.

The computer system 1400 may further include a network interface device 1408. The computer system 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), and a signal generation device 1416 (e.g., a speaker).

The secondary memory 1418 may include a machine-accessible storage medium (or more specifically a computer-readable storage medium) 1431 on which is stored one or more sets of instructions (e.g., software 1422) embodying any one or more of the methodologies or functions described herein. The software 1422 may also reside, completely or at least partially, within the main memory 1404 and/or within the processor 1402 during execution thereof by the computer system 1400, the main memory 1404 and the processor 1402 also constituting machine-readable storage media. The software 1422 may further be transmitted or received over a network 1420 via the network interface device 1408.

While the machine-accessible storage medium 1431 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, a method, a system and a computer readable medium having a set of instructions stored thereon for die-to-robot alignment for die-to-substrate bonding have been disclosed. In an embodiment, a robot is aligned with a substrate to provide a pre-aligned robot. A die is then aligned with the pre-aligned robot to provide a robot-aligned die. The robot-aligned die is finally bonded to a region of the substrate. The substrate is held stationary immediately following the aligning of the robot with the substrate and at least until the robot-aligned die is bonded to the region of the substrate.

What is claimed is:

1. A method of die-to-substrate bonding, comprising:
   aligning a robot with a substrate to provide a pre-aligned robot;
   aligning a die with said pre-aligned robot to provide a robot-aligned die; and
   bonding said robot-aligned die to a region of said substrate, wherein said substrate is held stationary immediately following the aligning of said robot with said substrate and at least until said robot-aligned die is bonded to said region of said substrate.

2. The method of claim 1, wherein aligning said robot comprises aligning a gantry comprising a holder and a robot arm.

3. The method of claim 1, wherein aligning said robot with said substrate comprises using said substrate having an alignment mark thereon.

4. The method of claim 3, wherein using said substrate having said alignment mark thereon comprises situating said alignment mark in said region of said substrate.

5. The method of claim 3, wherein using said substrate having said alignment mark thereon comprises situating said alignment mark in another region of said substrate, and wherein said another region is outside of said region of said substrate.

6. The method of claim 1, wherein aligning said robot with said substrate comprises using a type of alignment selected from the group consisting of translational alignment, rotational alignment, planarity alignment, and a combination of two or more thereof.

7. The method of claim 1, wherein aligning said robot with said substrate comprises aligning a robot alignment mark with a substrate alignment mark with an overlap error margin of at most 1 micron.

8. The method of claim 1, wherein bonding said robot-aligned die to said region of said substrate comprises using a technique selected from the group consisting of dielectric bonding, adhesive bonding, copper bonding, solder bonding, eutectic bonding and metal/adhesive redistribution layer bonding.

* * * * *